(12) United States Patent
Lu

(10) Patent No.: US 11,543,866 B2
(45) Date of Patent: Jan. 3, 2023

(54) M.2 INTERFACE MODULE AND SERVER INCLUDING THE SAME

(71) Applicants: Inventec (Pudong) Technology Corporation, Shanghai (CN); INVENTEC CORPORATION, Taipei (TW)

(72) Inventor: Xiaogang Lu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/381,624

(22) Filed: Jul. 21, 2021

(65) Prior Publication Data

US 2022/0374057 A1     Nov. 24, 2022

(30) Foreign Application Priority Data

May 24, 2021 (CN) .......................... 202110567312.0

(51) Int. Cl.
*H05K 7/14* (2006.01)
*G06F 1/18* (2006.01)

(52) U.S. Cl.
CPC ........... *G06F 1/185* (2013.01); *H05K 7/1418* (2013.01); *H05K 7/1487* (2013.01)

(58) Field of Classification Search
CPC combination set(s) only.
See application file for complete search history.

(56) References Cited

U.S. PATENT DOCUMENTS

| 9,292,054 B2 * | 3/2016 | Cai ...................... H05K 7/1487 |
| 2010/0309611 A1 * | 12/2010 | Fan .......................... G06F 1/188 361/679.01 |

\* cited by examiner

*Primary Examiner* — Hung S. Bui
(74) *Attorney, Agent, or Firm* — Locke Lord LLP; Tim Tingkang Xia, Esq.

(57) ABSTRACT

A server includes a casing, a frame, at least one movable carrier and at least one M.2 expansion card. The casing has a through hole. The frame has an opening and an accommodation space connected to the opening. The frame is fixed in the casing and the opening corresponds to the through hole, so that the accommodation space is exposed to exterior via the through hole. The at least one movable carrier is removably disposed in the accommodation space, and the at least one M.2 expansion card is disposed on the movable carrier.

7 Claims, 7 Drawing Sheets

M.2 INTERFACE MODULE AND SERVER INCLUDING THE SAME

CROSS-REFERENCE TO RELATED APPLICATIONS

This non-provisional application claims priority under 35 U.S.C. § 119(a) on Patent Application No(s). 202110567312.0 filed in China, on May 24, 2021, the entire contents of which are hereby incorporated by reference.

TECHNICAL FIELD

This disclosure relates to an M.2 interface module and a server including the same, more specifically to an extractable M.2 interface module and a server including the same.

BACKGROUND

With the coming of the internet era, a variety of technology and device developments related to the internet are growing flourishly.

Generally speaking, during the process of repairing, replacing or expanding of an interior assembly (e.g., a M.2 interface module) of a conventional server, the casing of the server needs to be removed and then the whole assembly of the server also needs to be dismantled with tools, such that the repairing, replacing or expanding of the interior assembly may be continued. As such, it leads to an unwanted operation of assembling and repairing to the assembly of the server, thus failing to meet users' demand of easy removal/installation of interior assemblies.

SUMMARY

Accordingly, this disclosure provides an M.2 interface module and a server including the same, which are configured to solve the problem that both the casing and the interior assembly of a conventional server need to be removed during the process of repairing, replacing or expanding of the interior assembly of the conventional server.

According to one embodiment of this disclosure, a server includes: a casing, having a through hole; a frame, having an opening and an accommodation space connected to the opening, wherein the frame is fixed in the casing and the opening corresponds to the through hole, so that the accommodation space is exposed to exterior via the through hole; at least one movable carrier, removably disposed in the accommodation space; and at least one M.2 expansion card, disposed on the at least one movable carrier.

According to one embodiment of this disclosure, an M.2 interface module is configured to be disposed on a casing of a server, and the M.2 interface module includes: a frame, having an opening and an accommodation space connected to the opening, wherein the frame is configured to be fixed in the casing, and the opening is configured to correspond to a through hole of the casing so that the accommodation space is exposed to exterior via the through hole; at least one movable carrier removably disposed in the accommodation space; and at least one M.2 expansion card disposed on the at least one movable carrier.

In view of the M.2 interface module and the server including the same in the above description, by disposing the through hole at the casing to expose the opening and the accommodation space of the frame of the M.2 interface module, the movable carriers with the M.2 expansion cards thereon may be directly inserted into the recesses of the accommodation space and removed from the recesses of the accommodation space through the opening of the frame, such that the repairing and the replacing of the M.2 expansion cards may be performed without having to remove the casing or remove the whole M.2 interface module. Therefore, the users can repair or replace the M.2 expansion card of the server more easily.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
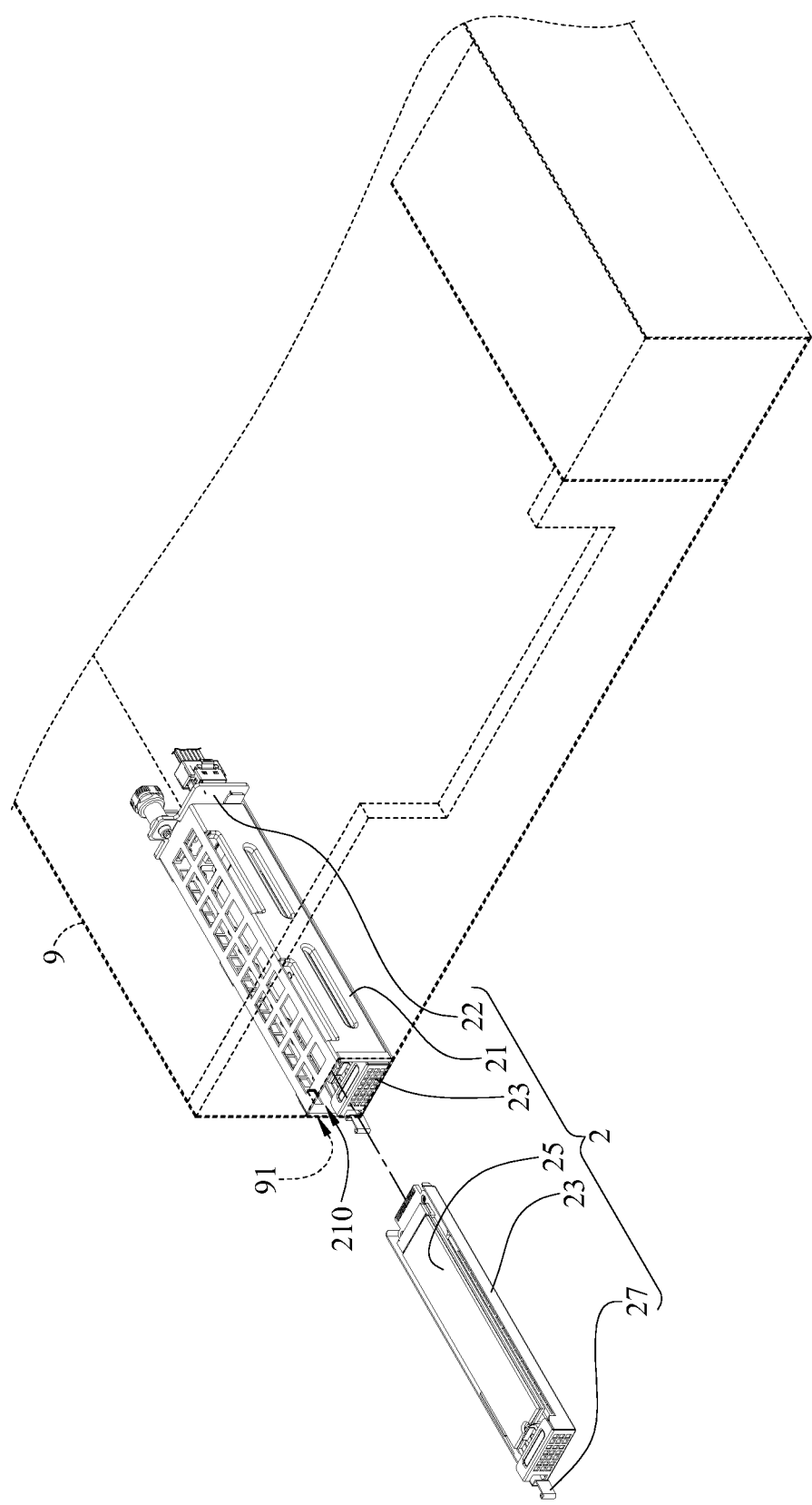
FIG. 1 is a partial exploded view of a server according to the first embodiment of the present disclosure.
Figure 2:
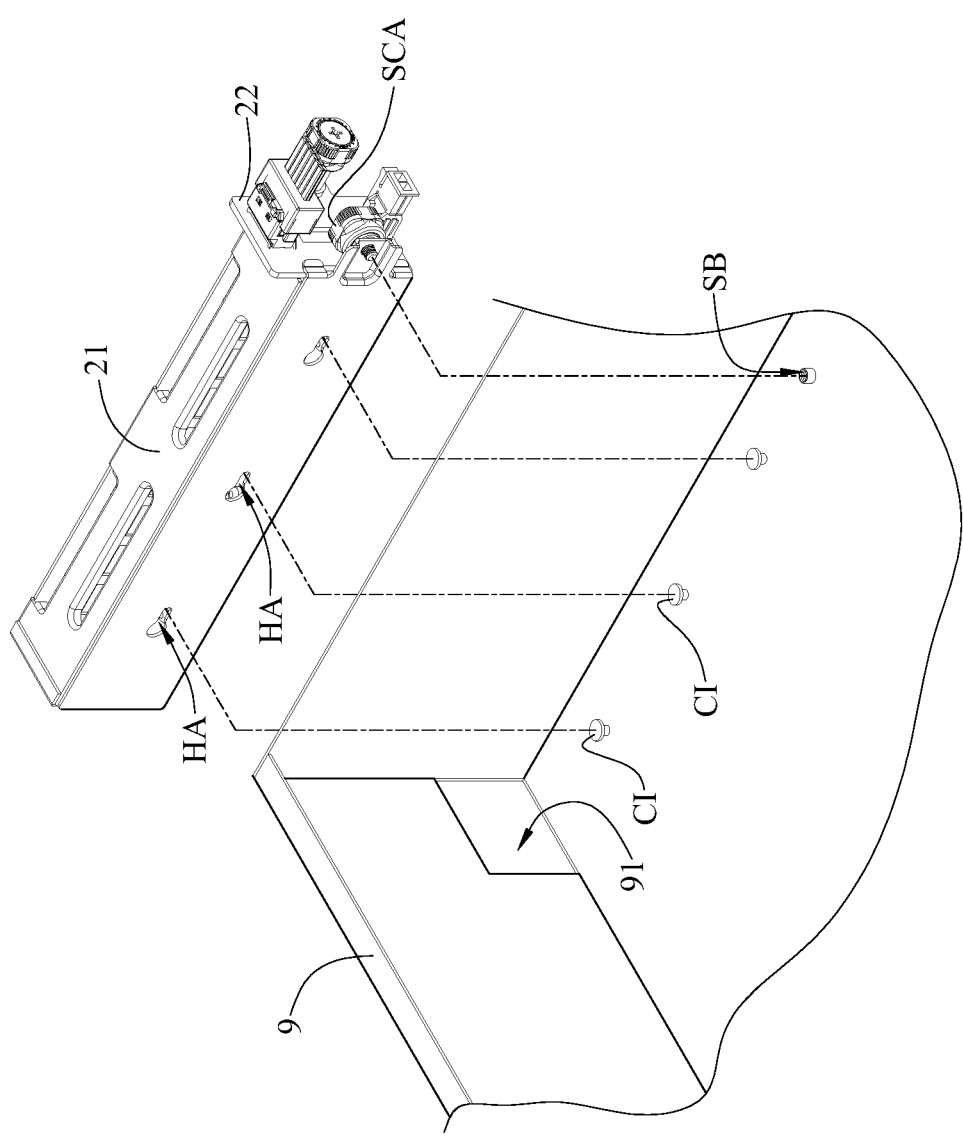
FIG. 2 is an exploded view of another side of the server in FIG. 1.
Figure 3:
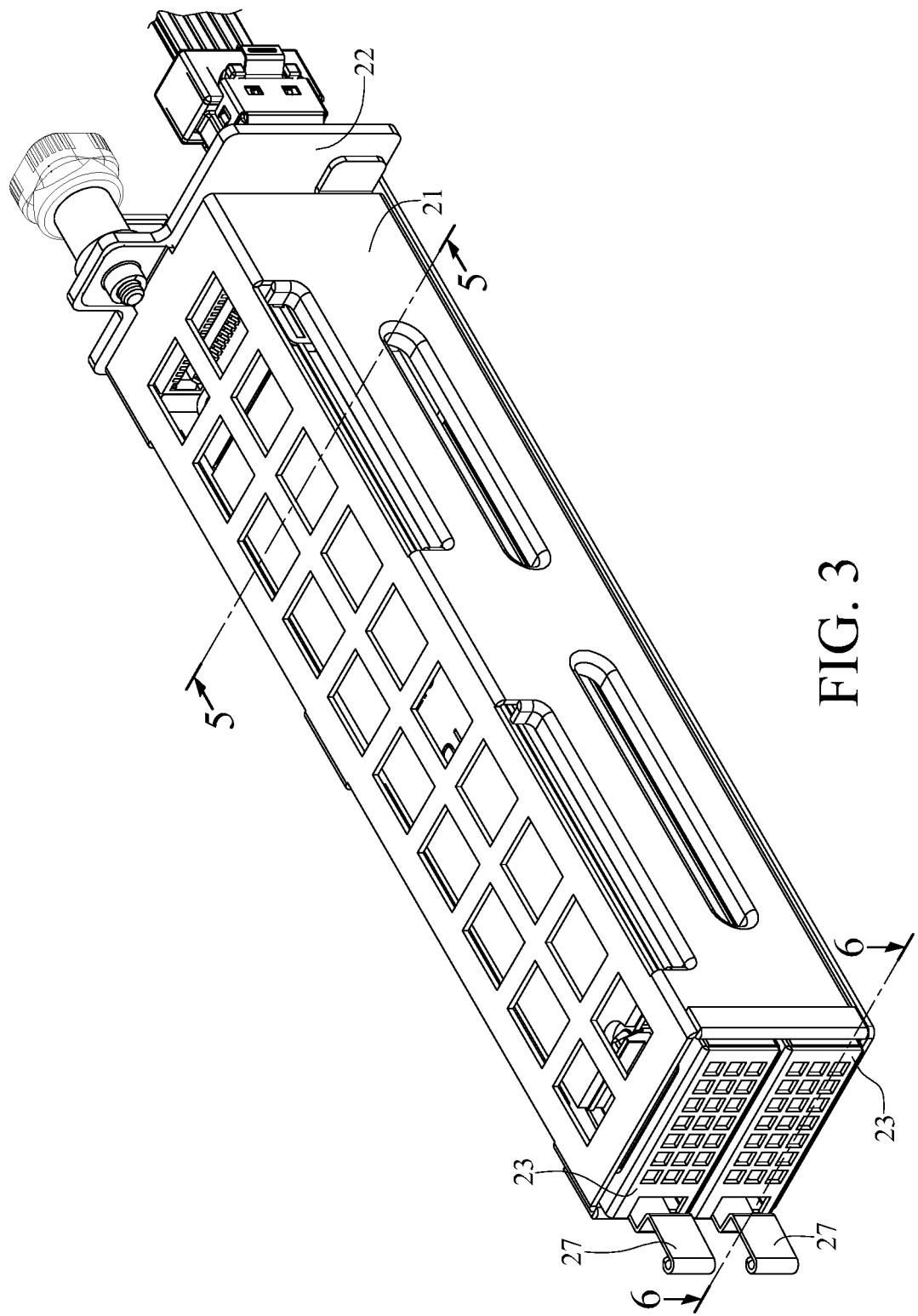
FIG. 3 is a perspective view of an M.2 interface module in FIG. 1.
Figure 4:
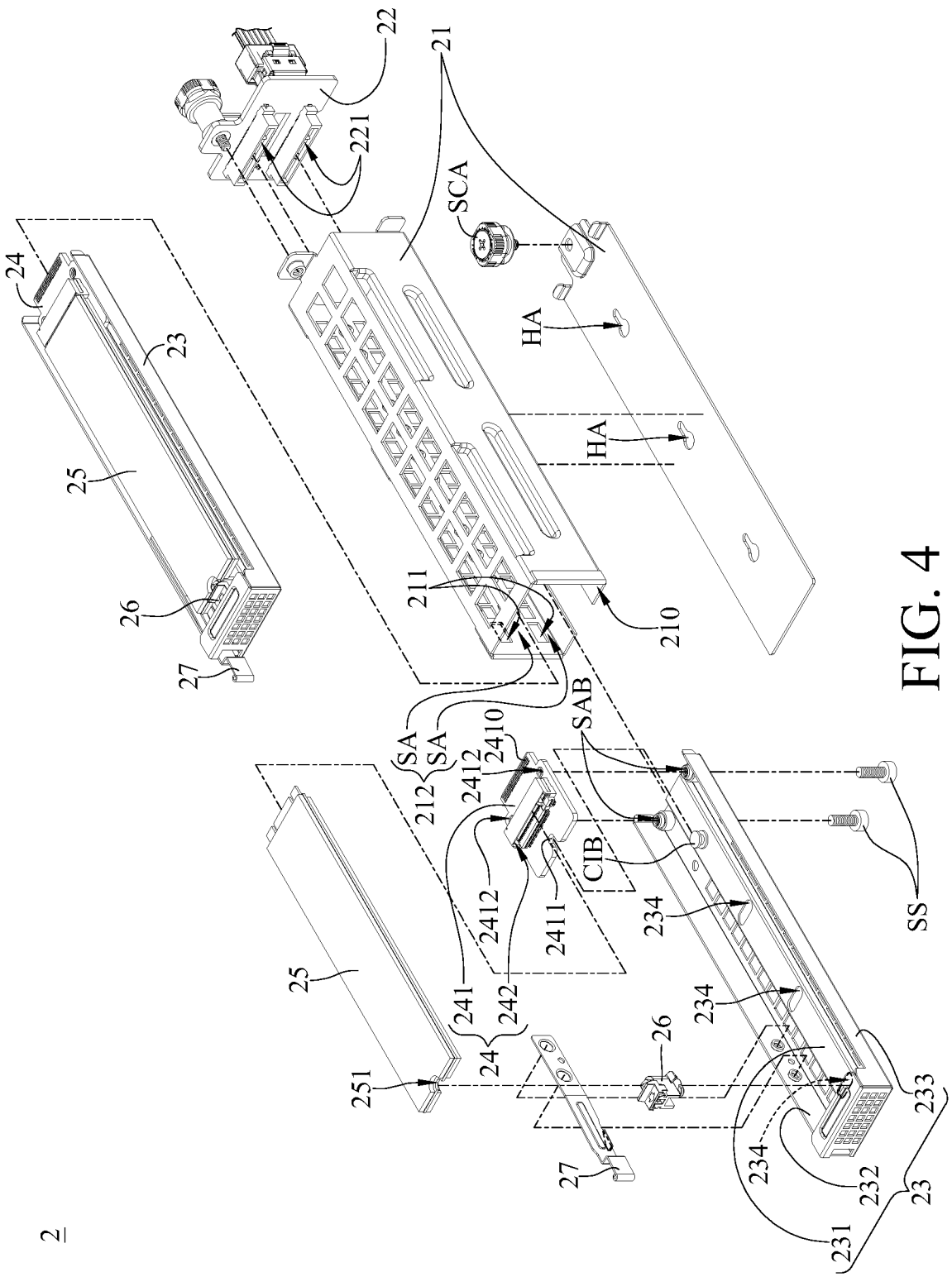
FIG. 4 is an exploded view of the M.2 interface module in FIG. 1.
Figure 5:
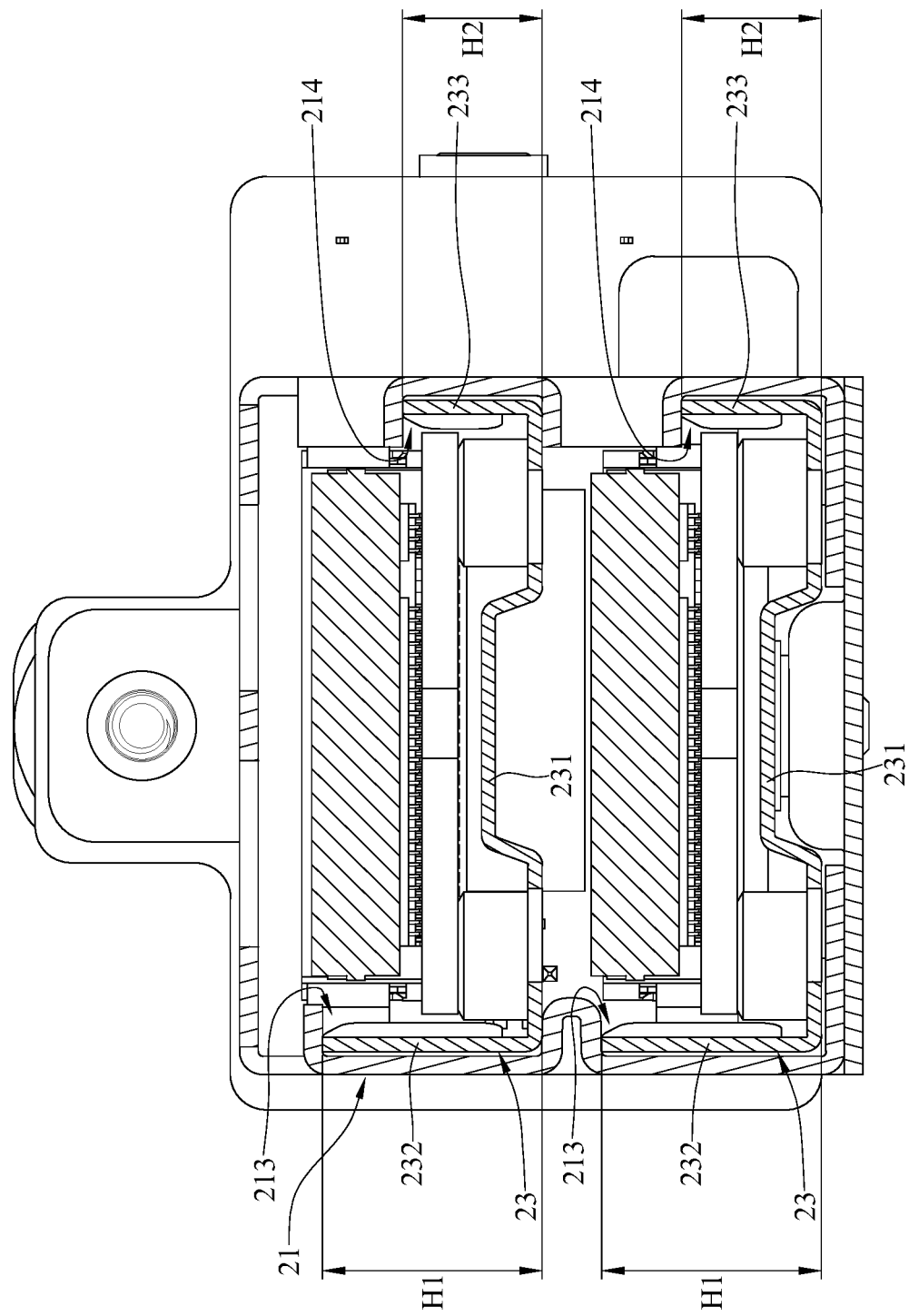
FIG. 5 is a cross-sectional view of the M.2 interface module along line 5-5 in FIG. 3.

Please refer to FIG. 1 to FIG. 5. FIG. 1 is a partial exploded view of a server 1 according to the first embodiment of the present disclosure; FIG. 2 is an exploded view of another side of the server 1; FIG. 3 is a perspective view of an M.2 interface module 2; FIG. 4 is an exploded view of the M.2 interface module 2; and FIG. 5 is a cross-sectional view of the M.2 interface module along line 5-5 in FIG. 3.

In this embodiment, a server 1 includes a casing 9 and an M.2 interface module 2. The casing 9 has a through hole 91 located at a front panel or a back panel of the casing 9, and the M.2 interface module 2 is disposed in the casing 9.

The M.2 interface module 2 includes a frame 21, a backplane 22, two movable carriers 23, two adapters 24, two M.2 expansion cards 25, two fixing plugs 26 and two elastic fasteners 27.

The frame 21 is fixed in the casing 9. The frame 21 has an opening 210, two snap holes 211 and an accommodation space 212 connected to the opening 210. The opening 210 corresponds to the through hole 91, so that the accommodation space 212 is exposed to exterior via the through hole 91. The accommodation space 212 includes two recesses SA, and the two snap holes 211 are correspondingly and respectively located on one side of the two recesses SA. In the embodiment, the frame 21 further has a plurality of pear-shaped holes HA and a hand screw SCA. The pear-shaped holes HA respectively correspond to a plurality of I-shaped pins CI of the casing 9, and the hand screw SCA corresponds to a screw hole SB, such that the pear-shaped holes HA of the frame 21 slide along the I-shaped pins CI are slid into the pear-shaped holes by the pear-shaped holes HA of the frame 21 slid along the I-shaped pins CI, and then the hand screw SCA is screwed corresponding to the bolt hole so as to fix the casing 9.

The backplane 22 is fixed to the frame 21 and located at one side opposite to the opening 210. The backplane 22 has two first ports for coupling with the adapters 24.

The two movable carriers 23 are respectively and removably disposed in the two recesses SA. The movable carriers 23 are insertable into the recesses SA through the opening 210 and removable from the recesses SA through the opening 210.

More specifically, the movable carriers 23 each includes a bottom plate 231 and a first side wall 232 and a second side wall 233 respectively connected to two sides of the bottom plate 231. A height of the first side wall 232 is larger than a height of the second side wall 233. The frame 21 further has a first guiding groove 213 and a second guiding groove 214 respectively corresponding to and accommodating the first side wall 232 and the second side wall 233. A height of the first guiding groove 213 is larger than a height of the second guiding groove 214, and the height of the first side wall 232 is larger than the height of the second guiding groove 214. That is, the size of the first guiding groove 213 matches the size of the first side wall 232, and the size of the second guiding groove 214 matches the size of the second side wall 233. As such, since the height of the first side wall 232 is larger than the height of the second guiding groove 214, the first side wall 232 cannot be inserted into the second guiding groove 214. Therefore, it prevents the movable carriers 23 from being inserted into the recesses SA in an opposite direction, thereby realizing foolproof protection. However, the above foolproof design of the M.2 interface module is optional, and the present disclosure is not limited thereto.

The two adapters 24 each includes a circuit board 241 and a second port 242. The circuit board 241 has a connecting part 2410, a recessed part 2411 and two fastening parts 2412. The recessed part 2411 and the two fastening parts 2412 are not collinear. The connecting part 2410 is removably inserted into a first port 221 of the backplane 22, the recessed part 2411 is engaged with an I-shaped pin CM, and two fastening holes SAB of each of the movable carriers 23 respectively correspond to the two fastening parts 2412 and the circuit board 241 is fixed to the movable carrier 23 through two screws SS disposed through the fastening holes SAB and screwed to the fastening parts 2412. The second port 242 is disposed on the circuit board 241, and the second port 242 is configured for the M.2 expansion card 25 to be inserted thereinto.

The two M.2 expansion cards 25 are respectively disposed on the two movable carriers 23 and inserted into the second ports 242 of the adapter 24. Regarding the M.2 expansion card, M.2 is a specification for internally mounted computer expansion cards and associated connectors. M.2 replaces the mSATA standard, which uses the PCI Express Mini Card physical card layout and connectors. Employing a more flexible physical specification, the M.2 allows different module widths and lengths, and, paired with the availability of more advanced interfacing features, makes the M.2 more suitable than mSATA in general for solid-state storage applications, and particularly in smaller devices such as ultrabooks and tablets. Computer bus interfaces provided through the M.2 connector are, for example, Serial ATA, PCI Express, and USB. It is up to the manufacturer of the M.2 host or module to select which interfaces are to be supported, depending on the desired level of host support and device type. In addition, M.2 modules can integrate multiple functions, including the following device classes: Wi-Fi, Bluetooth, satellite navigation, near field communication (NFC), digital radio, WiGig, wireless WAN (WWAN), and solid-state drives.

Each of the fixing plugs 26 is disposed through an engaging through hole 251 of each of the M.2 expansion cards 25 and fastened to one of the plurality of fixing holes 234 of the movable carrier 23. The distances between the plurality of fixing holes 234 of the movable carrier 23 and the second port 242 of the adapter 24 are substantially, for example, 60 mm, 80 mm and 110 mm, thereby supporting an M.2 expansion card of length of 60 mm, 80 mm or 110 mm, fully expanding the disposal compatibility of system. However, the present disclosure is not limited to the above described three exemplary distances. In other embodiments, the distance between the fixing hole of the movable carrier and the second port of the adapter may be designed to support an M.2 expansion card of other length.

Figure 6:
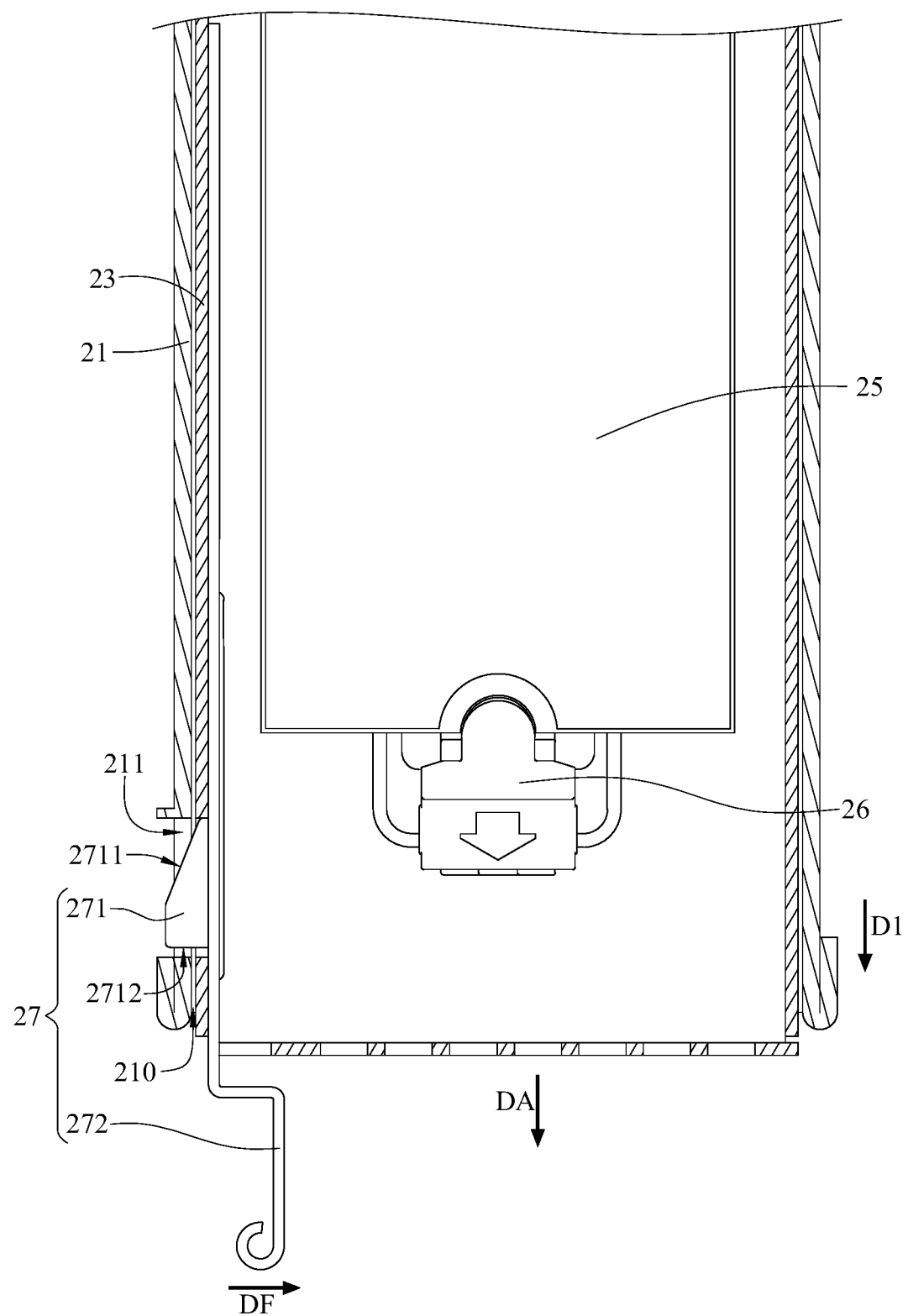
FIG. 6 and FIG. 7 show the operation processes of some components of the M.2 interface module in FIG. 3.
Figure 7:
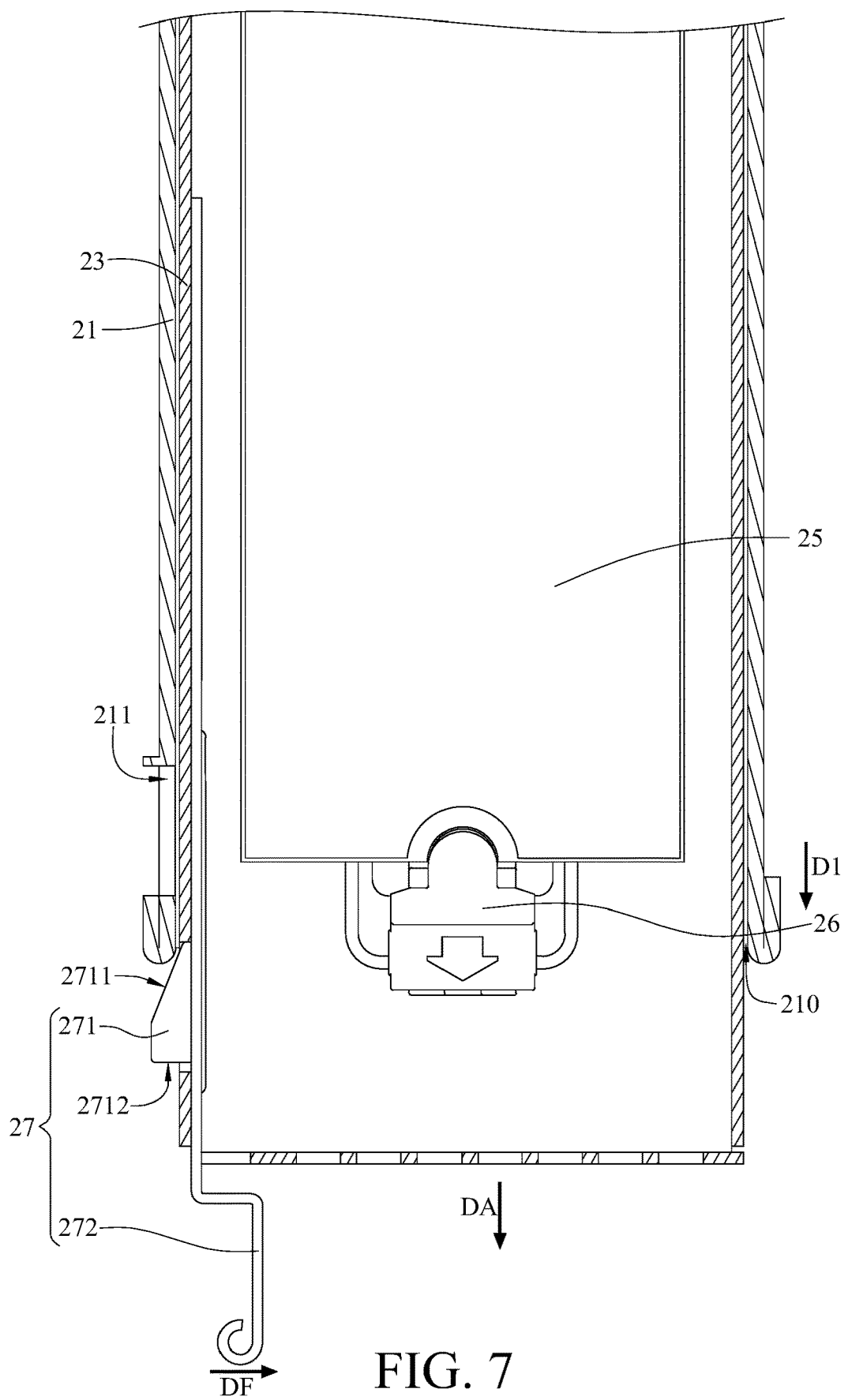

Please refer to FIG. 6 and FIG. 7, which show the operation processes of some components of the M.2 interface module in FIG. 3.

The two elastic fasteners 27 are respectively fixed to the two movable carriers 23. Each of the elastic fasteners 27 includes a protrusion part 271 and an operation part 272. The protrusion part 271 is removably disposed through the snap hole 211, so that the movable carrier 23 is fixed in the recess SA of the accommodation space 212. Specifically, the protrusion part 271 has a leaning surface 2711 and a blocking surface 2712. The leaning surface 2711 faces toward the snap hole 211, and a distance between the leaning surface 2711 and the movable carrier 23 increases in a direction D1 from the snap hole 211 to the opening 210. The blocking surface 2712 is connected to the leaning surface 2711, faces toward the opening 210 and is abutted against a surface of the frame 21 and surrounding the snap hole 211.

The operation part 272 is connected to the protrusion part 271 and extends outward from the through hole 91 of the casing 9. The operation part 272 is movable from a fastened position to an unlock position by an external force along a force direction DF. When the operation part 272 is moved from the fastened position to the unlock position, the protrusion part 271 is moved along with the operation part 272 to detach the snap hole 211, so that the movable carrier 23 is movable relative to the frame 21. As such, the movable carrier 23 is removable from the recess SA of the accommodation space 212 along an extract direction DA.

On the other hand, when a user wants to install the movable carrier 23 back to the recess SA of the frame 21, the user only needs to insert the movable carrier 23 into the recess SA along a direction opposite to the extract direction, and then the leaning surface 2711 of the protrusion part 271 presses against the frame 21, such that the operation part 272 gradually deforms along the force direction DF and stores an elastic force. When the movable carrier 23 is moved along a direction opposite to the extract direction DA until the leaning surface 2711 is no longer in contact with the frame 21 and is completely located on one side of the snap hole 211, the operation part 272 releases the elastic force and moves back along the direction opposite to the force direction DF, making the protrusion part 271 disposed through the snap hole 211, and making a surface of the frame 21 surrounding the snap hole 211 blocking the blocking surface 2712 of the protrusion part 271 so as to limit a displacement of the protrusion part 271 in the extract direction DA, thereby completing the assembling of the movable carrier 23.

In this embodiment, the movable carriers 23 are fixed to the frame 21 through the elastic fastener 27, but the present disclosure is not limited thereto. In other embodiments, movable carriers in other embodiments may be fixed to the frame through other fixing means such as quick release screws or fixing plugs.

In this embodiment, the accommodation space 212 of the frame 21 of the M.2 interface module 2 has two recesses SA, but the present disclosure is not limited thereto. In other embodiments, an accommodation space may be designed to have one or at least three recesses configured to accommodate one or at least three movable carriers with M.2 expansion cards.

In view of the M.2 interface module and the server including the same in the above embodiment, by disposing the through hole at the casing to expose the opening and the accommodation space of the frame of the M.2 interface module, the movable carriers with the M.2 expansion cards thereon may be directly inserted into the recesses of the accommodation space and removed from the recesses of the accommodation space through the opening of the frame such that the repairing and the replacing of the M.2 expansion cards may be performed without having to remove the casing or remove the whole M.2 interface module. Therefore, the users can repair or replace the M.2 expansion card of the server more easily.

Also, since the accommodation space of the frame is connected to exterior through the through holes of the casing, and the frame may be disposed with a plurality of ventilating holes, the M.2 interface module may have a good ventilation which is beneficial to its heat dissipation.

Moreover, the M.2 interface module has the tool-less elastic fastener. By having the protrusion part disposed through the snap hole, the movable carrier can be fixed in the recess. On the other hand, by moving the operation part from the fastened position to the unlock position so that the protrusion part is detached from the snap hole, the movable carrier is removable from the frame. Accordingly, the dismantling and the assembling without tools can be achieved.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A server, comprising:
a casing, having a through hole;
a frame, having an opening and an accommodation space connected to the opening, wherein the frame is fixed in the casing and the opening corresponds to the through hole, so that the accommodation space is exposed to exterior via the through hole;
at least one movable carrier, removably disposed in the accommodation space; and
at least one M.2 expansion card, disposed on the at least one movable carrier;
wherein the server further comprises a backplane and at least one adapter, the backplane is fixed to the frame and located at one side opposite to the opening, the backplane has at least one first port, the at least one adapter comprises a circuit board and a second port, the circuit board is fixed to the at least one movable carrier, the circuit board has a connecting part, the connecting part is removably inserted into the at least one first port, the second port is disposed on the circuit board, and the at least one M.2 expansion card is inserted into the second port;
wherein the circuit board further has a recessed part and two fastening parts, the at least one movable carrier includes an I-shaped pin and two fastening holes, the recessed part and the two fastening parts are not collinear, the recessed part is abutted against the I-shaped pin, the fastening holes respectively correspond to the fastening parts, and the circuit board is fixed to the at least one movable carrier by two screws disposed through the fastening holes and screwed into the fastening part.

2. The server of claim 1, further comprising at least one elastic fastener, wherein the frame further has at least one snap hole, the at least one elastic fastener is fixed to the at least one movable carrier, the at least one elastic fastener comprises a protrusion part and an operation part, the protrusion part is removably disposed through the at least one snap hole so that the at least one movable carrier is fixed in the accommodation space, the operation part is connected to the protrusion part and extends outward from the through hole, the operation part is movable from a fastened position to an unlock position by an external force; when the operation part is moved from the fastened position to the unlock position, the protrusion part is moved along with the operation part to detach the at least one snap hole, so that the at least one movable carrier is movable relative to the frame.

3. The server of claim 2, wherein the protrusion part has a leaning surface and a blocking surface, the leaning surface faces toward the at least one snap hole, a distance between the leaning surface and the at least one movable carrier increases in a direction from the at least one snap hole to the opening, and the blocking surface faces toward the opening and is abutted against a surface of the frame surrounding the at least one snap hole.

4. The server of claim 2, wherein the quantity of the at least one movable carrier is two, the quantity of the at least one M.2 expansion card is two, the quantity of the at least one snap hole is two, the quantity of the at least one elastic fastener is two, the two M.2 expansion cards are respectively disposed on the two movable carriers, the two elastic fasteners are respectively fixed to the two movable carriers, and the protrusion parts of the two elastic fasteners are respectively removably disposed through the two snap holes.

5. The server of claim 1, further comprising at least one fixing plug, wherein the at least one movable carrier has a plurality of fixing holes, the at least one fixing plug is disposed through an engaging through hole of the at least one M.2 expansion card and is engaged with one of the plurality of fixing holes.

6. The server of claim 1, wherein the at least one movable carrier comprises a bottom plate and a first side wall and a second side wall respectively connected to two sides of the bottom plate, a height of the first side wall is larger than a height of the second side wall, the frame further has a first guiding groove and a second guiding groove respectively corresponding to and accommodating the first side wall and the second side wall, a height of the first guiding groove is larger than a height of the second guiding groove, and the height of the first side wall is larger than the height of the second guiding groove.

7. The server of claim 1, wherein the through hole is located at a front panel or a back panel of the casing.

* * * * *